US008709838B2

(12) United States Patent
Suzuki et al.

(10) Patent No.: US 8,709,838 B2
(45) Date of Patent: Apr. 29, 2014

(54) METHOD FOR PREPARING A β-SIALON PHOSPHOR (71) Applicant: Samsung Electronics Co., Ltd., Gyeonggi-do (KR)

(72) Inventors: Hideo Suzuki, Suwon (KR); Chul Soo Yoon, Suwon (KR); Hyong Sik Won, Suwon (KR); Jeong Ho Ryu, Suwon (KR); Youn Gon Park, Suwon (KR); Sang Hyun Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/777,999

(22) Filed: Feb. 26, 2013

(65) Prior Publication Data
US 2013/0168888 A1 Jul. 4, 2013

Related U.S. Application Data (62) Division of application No. 13/058,961, filed as application No. PCT/KR2009/004512 on Aug. 12, 2009.

(30) Foreign Application Priority Data

Aug. 12, 2008 (KR) .................. 10-2008-0079013
Dec. 16, 2008 (KR) .................. 10-2008-0127943
Aug. 12, 2009 (KR) .................. 10-2009-0074275

(51) Int. Cl.
*H01L 21/00* (2006.01)
(52) U.S. Cl.
USPC ................. 438/22; 438/25; 438/26; 438/27; 438/29; 257/98; 257/100; 257/E33.066

(58) Field of Classification Search
CPC ....... H01L 33/502; H01L 33/50; H01L 33/60; H01L 33/504; H01L 27/3244; H01L 33/62; H01L 2924/01079; C09K 11/7728
USPC .......... 257/98, 100, E33.066; 438/22, 25, 26, 438/27, 29, 24
See application file for complete search history.

(56) References Cited

U.S. PATENT DOCUMENTS 7,815,817 B2 * 10/2010 Hirosaki ................. 252/301.4 F
8,158,026 B2 * 4/2012 Suzuki et al. ........... 252/301.4 F
(Continued)

FOREIGN PATENT DOCUMENTS

CN          1535933 A    10/2004
CN        101186820 A     5/2008
(Continued)

OTHER PUBLICATIONS

Chinese Office Action, w/ English translation thereof, issued in Chinese Patent Application No. CN 200980140497.4 dated Apr. 3, 2013.
(Continued)

*Primary Examiner* — Thinh T Nguyen
(74) *Attorney, Agent, or Firm* — McDermott Will & Emery LLP (57) ABSTRACT

There is provided a method for preparing a β-SiAlON phosphor capable of be controlled to show characteristics such as high brightness and desired particle size distribution. The method for preparing a β-SiAlON phosphor represented by Formula: $Si_{(6-x)}Al_xO_yN_{(8-y)}:Ln_z$ (wherein, Ln is a rare earth element, and the following requirements are satisfied: $0<x\leq4.2$, $0<y\leq4.2$, and $0<z\leq1.0$) includes: mixing starting materials to prepare a raw material mixture; and heating the raw material mixture in a nitrogen-containing atmospheric gas, wherein the starting materials includes a host raw material including a silicon raw material including metallic silicon, and at least one aluminum raw material selected from the group consisting of metallic aluminum and aluminum compound, and at least activator raw material selected from the rare earth elements for activating the host raw material.

8 Claims, 8 Drawing Sheets

(56) References Cited

U.S. PATENT DOCUMENTS

| | | |
|---|---|---|
| 2006/0208262 A1 | 9/2006 | Sakuma et al. |
| 2007/0108896 A1 | 5/2007 | Hirosaki |
| 2007/0164308 A1 | 7/2007 | Yoshimura et al. |
| 2007/0278930 A1 | 12/2007 | Takahashi et al. |
| 2008/0258602 A1 | 10/2008 | Masuda et al. |
| 2008/0265269 A1 | 10/2008 | Yoo et al. |
| 2008/0297031 A1* | 12/2008 | Takahashi et al. ............ 313/503 |
| 2009/0140205 A1 | 6/2009 | Kijima et al. |
| 2009/0146549 A1 | 6/2009 | Kimura et al. |
| 2010/0181580 A1 | 7/2010 | Masuda |
| 2011/0121234 A1 | 5/2011 | Hirosaki |

FOREIGN PATENT DOCUMENTS

| | | |
|---|---|---|
| CN | 101195744 A | 6/2008 |
| CN | 101315853 A | 12/2008 |
| DE | 11 2005 000 044 T5 | 7/2006 |
| EP | 0 155 047 A1 | 9/1985 |
| EP | 0 796 828 A2 | 9/1997 |
| TW | 200811269 A | 3/2008 |
| WO | 94/24513 A1 | 10/1994 |
| WO | 2006/126819 A1 | 11/2006 |
| WO | 2007/066733 A1 | 6/2007 |
| WO | 2009/011205 A1 | 1/2009 |

OTHER PUBLICATIONS

Chinese Office Action, w/ English translation thereof, issued in Chinese Patent Application No. CN 200980140497.4 dated Dec. 13, 2013.

German Office Action, w/ English translation thereof, issued in German Patent Application No. 11 2009 001 977.3 dated Jan. 28, 2014.

* cited by examiner

METHOD FOR PREPARING A β-SIALON PHOSPHOR

CROSS-REFERENCE TO RELATED APPLICATION

This application is a divisional of U.S. application Ser. No. 13/058,961 filed Apr. 28, 2011, which is a national stage of PCT/KR2009/004512 filed Aug. 12, 2009, which claims priority from Korean Patent Application Nos. 10-2008-0079013 filed Aug. 12, 2008; 10-2008-0127943 filed Dec. 16, 2008 and 10-2009-0074275 filed Aug. 12, 2009. The contents of each are hereby incorporated by reference.

TECHNICAL FIELD

The present invention relates to a method for preparing a β-SiAlON phosphor, and more particularly, to a method for preparing a β-SiAlON phosphor capable of be controlled to show characteristics such as high brightness and desired particle size distribution.

BACKGROUND ART

SiAlON phosphors are a kind of oxynitride phosphors including chemical elements such as Si, Al, O and N, and it has been known that there are two kinds of the SiAlON phosphors having different crystal structures: α-SiAlON phosphor and β-SiAlON phosphor. The α-SiAlON phosphor is described in non-patent reference 1, and the α-SiAlON phosphor and the use of LED using the same are described in patent references 1 to 4. Also, the β-SiAlON phosphor is described in patent reference 5, and the β-SiAlON phosphor and the use of LED using the same are described in patent reference 6.

[Non-patent reference 1] J. W. H. van Krebel "On new rare earth doped M-Si—Al—O—N materials", Tu Eindhoven The Netherland, P 145-161(1998)

[Patent reference 1] Japanese Laid-Open Patent Publication No. 2002-363554

[Patent reference 2] Japanese Laid-Open Patent Publication No. 2003-336059

[Patent reference 3] Japanese Laid-Open Patent Publication No. 2004-238505

[Patent reference 4] Japanese Laid-Open Patent Publication No. 2007-31201

[Patent reference 5] Japanese Laid-Open Patent Publication No. Sho60-206889

[Patent reference 6] Japanese Laid-Open Patent Publication No. 2005-255895

α-SiAlON has a crystal structure having a unit structure represented by Formula: $Si_{12-(m+n)}Al_{(m+n)}O_nN_{16-n}$ and having two sites formed therein. Metal ions, such as $Ca^{2+}$ having a relatively smaller ion radius may be dissolved into the sites, and the metal ion-dissolved α-SiAlON may be represented by Formula: $M_{m/v}Si_{12-(m+n)}Al_{(m+n)}O_nN_{16-n}$:Eu (wherein, M is a metal ion, v represents a valence of the metal ion). It has been known that α-SiAlON in which Ca and an activator Eu are dissolved is a yellow-emitting phosphor, as described in the non-patent reference 1 and the patent reference 1. The α-SiAlON phosphor has an excitation wavelength band ranging from ultraviolet rays to blue light. Therefore, it was expected that the α-SiAlON phosphor will be used as a yellow-emitting phosphor for white LED since it is allowed to emit a yellow light when it is irradiated with the ultraviolet rays or blue light.

The yellow-emitting phosphor may be prepared by weighing europium oxide and starting materials such as silicon nitride, aluminum nitride and calcium carbonate ($CaCO_3$), all of which are used in the form of powder, mixing certain amounts of the europium oxide and the starting materials, and firing the resulting mixture at high temperature under a nitrogen-containing atmosphere. Also, there have been a proposal for a high-purity raw material in which a content of impurities is stipulated (Patent reference 3), or a proposal for the use of metallic silicon (Patent reference 4) in order to provide high brightness.

Meanwhile, it has been known that β-SiAlON has a crystal structure represented by Formula: $Si_{6-x}Al_xO_xN_{8-x}$, and has no large site formed in crystal thereof unlike the α-SiAlON. The patent references 5 and 6 disclose a β-SiAlON phosphor prepared by adding an activator to β-SiAlON. The patent reference 5 proposes a β-SiAlON phosphor using a metal element (i.e. Cu, Ag, or Mn) and a rare earth element (i.e. Eu) as the activator in β-SiAlON. Also, the Eu-activated β-SiAlON phosphors were reported in the patent references 5 and 6, respectively. However, it was reported that the Eu-activated β-SiAlON phosphor described in the patent reference 5 is allowed to emit light at a blue-emitting band of 410 to 440 nm, and the Eu-activated β-SiAlON phosphor described in the patent reference 6 is a green-emitting phosphor. From these results, it was supposed that the difference in emission colors of the Eu-activated β-SiAlON phosphors is derived from the fact that, since Eu-activated β-SiAlON phosphor of the patent reference 5 has a low firing temperature, Eu is not sufficiently dissolved into β-SiAlON, as described above in the patent reference 6.

The Eu-activated β-SiAlON phosphor of the patent reference 6 is characteristic of being exited to emit a green light when it was exposed to the light that is of an ultraviolet ray to a blue light range. Therefore, the Eu-activated β-SiAlON phosphor has received attention as a green-emitting phosphor for white LED that is composed of blue LED and a phosphor, or UV LED and a phosphor. In particular, it is expected that the Eu-activated β-SiAlON phosphor is used as a green-emitting phosphor for white LED requiring high color reproductions since it has a narrow spectrum width of approximately 55 nm and shows its good color purity. However, there is a demand for enhancing brightness of the Eu-activated β-SiAlON phosphor since the Eu-activated β-SiAlON phosphor shows its insufficient brightness.

The β-SiAlON phosphor is prepared by weighing starting materials such as silicon nitride and aluminum nitride and an activator, all of which are used in the form of powder, mixing certain amounts of the starting materials and the activator, and firing the resulting mixture at high temperature in a nitrogen-containing atmosphere. Also, the patent reference 6 discloses a method for preparing a Eu-activated β-SiAlON phosphor. Here, the Eu-activated β-SiAlON phosphor is prepared by weighing starting materials such as silicon nitride and aluminum nitride (or, aluminum oxide) and europium oxide, mixing certain amounts of the starting materials and the europium oxide, and firing the resulting mixture at a high temperature of 1850° C. or above in a nitrogen-containing atmosphere.

As described above, the conventional method, as described in the patent reference 6, using the recently known nitride raw materials such as silicon nitride and aluminum nitride as starting materials has a problem in that it is impossible to obtain a β-SiAlON phosphor having sufficiently high brightness. Also, when the conventional method is used in the field of applications such as white LED, it is necessary to control the particle size distribution such as particle sizes or particle shapes, in addition to the light-emitting characteristics of the β-SiAlON phosphor, so that the particle size distribution can affect luminous efficiency of the white LED device. Also, it is necessary to use a suitable β-SiAlON phosphor for the white LED device since the particle size distribution of the β-SiAlON phosphor affects a manufacturing ratio of the final products.

Furthermore, there are limits on the makers that are able to manufacture silicon nitride and/or aluminum nitride, and therefore kinds of high purity silicon nitride and/or high purity aluminum nitride used as the raw materials are not so much. As a result, there are limitations on the nitride raw materials used, that is, the nitride raw materials having sufficiently high purity are not present in common-grade products and/or the cost of the nitride raw materials is high. That is to say, in the case of the brightness and the particle size distribution depending on the kinds of the used nitride raw materials, the limitations on the nitride raw materials may cause the brightness to be deteriorated and the particle size distribution to be controlled insufficiently.

DISCLOSURE

Technical Problem

The present invention is designed to solve the problems of the prior art, and therefore it is an object of the present invention to provide a method for preparing a β-SiAlON phosphor capable of be controlled to show characteristics such as high brightness and desired particle size distribution.

Technical Solution

According to an aspect of the present invention, there is provided a method for preparing a β-SiAlON phosphor represented by Formula: $Si_{(6-x)}Al_xO_yN_{(8-y)}:Ln_z$ wherein, Ln is a rare earth element, and the following requirements are satisfied: $0<x\leq4.2$, $0<y\leq4.2$, and $0<z\leq1.0$). Here, the method includes: mixing starting materials to prepare a raw material mixture; and heating the raw material mixture in a nitrogen-containing atmospheric gas, wherein the starting materials includes a host raw material including a silicon raw material including metallic silicon, and at least one aluminum raw material selected from the group consisting of metallic aluminum and aluminum compound, and at least one activator raw material selected from the rare earth elements for activating the host raw material. In this case, the rare earth element may include Eu or Ce.

Also, the silicon raw material may include metallic silicon and silicon compound, wherein the silicon compound includes at least one selected from the group consisting of silicon nitride and silicon oxide. Also, the aluminum compound may include at least one selected from the group consisting of aluminum nitride, aluminum oxide and aluminum hydroxide.

Additionally, the β-SiAlON phosphor may have a peak wavelength of 500 to 570 nm.

Furthermore, when the raw material mixture is heated, the nitrogen-containing atmospheric gas may have an $N_2$ concentration of 90% or more and a gas pressure of 0.1 to 20 Mpa, and a heating temperature of the raw material mixture may be in a temperature range of 1850 to 2150° C.

Advantageous Effects

The method for preparing a β-SiAlON phosphor according to one exemplary embodiment of the present invention may be useful to prepare a β-SiAlON phosphor having a high brightness by using metallic silicon as some or all of the silicon raw material so as to prepare β-SiAlON phosphors.

Also, the method for preparing a β-SiAlON phosphor according to one exemplary embodiment of the present invention may be useful to manufacture more reliable LEDs in the use of the β-SiAlON phosphor since the particle size distribution of the β-SiAlON phosphor may be controlled to a desired level in the preparation of the β-SiAlON phosphor.

MODE FOR INVENTION

Hereinafter, exemplary embodiments of the present invention will now be described in detail with reference to the accompanying drawings. However, it is apparent to those skilled in the art that modifications and variations may be made without departing from the scope of the invention. Therefore, the exemplary embodiments of the present invention will be provided for the purpose of better understanding of the present invention as apparent to those skilled in the art.

The method for preparing a β-SiAlON phosphor according to one exemplary embodiment of the present invention is characterized in that the β-SiAlON phosphor is represented by Formula: $Si_{(6-x)}Al_xO_yN_{(8-y)}:Ln_z$ (wherein, Ln is a rare earth element, and the following requirements are satisfied: $0<x\leq4.2$, $0<y\leq4.2$, and $0<z\leq1.0$). Here, the method according to one exemplary embodiment of the present invention includes: mixing starting materials to prepare a raw material mixture; and heating the raw material mixture in a nitrogen-containing atmospheric gas, wherein the starting materials includes a host raw material including a silicon raw material including metallic silicon, and at least one aluminum raw material selected from the group consisting of metallic aluminum and aluminum compound, and at least one activator raw material selected from the rare earth elements for activating the host raw material.

In accordance with one exemplary embodiment of the present invention, raw materials are mixed and heated in a nitrogen-containing atmospheric gas to prepare a β-SiAlON phosphor. Materials including silicon, aluminum, and an activator (i.e. rare earth metals) are used as the raw materials.

The silicon raw material includes raw materials including silicon. Here, only metallic silicon is used as the silicon raw material, or a silicon compound including other kinds of silicon in addition to the metallic silicon may be mixed and used as the silicon raw material. In this case, silicon nitride or silicon oxide may be used as the silicon compound.

The metallic silicon is preferably high-purity metallic silicon that is in the form of powder and has a low content of impurities such as Fe. In the case of the metallic silicon powder, its particle diameter or particle distribution does not directly affect a particle system of the β-SiAlON phosphor. However, the particle diameter or particle distribution of the metallic silicon powder affects the particle size distribution, such as particle sizes or particle shapes, of the β-SiAlON phosphor through the sintering conditions or a combination of the raw materials, and also affects emissions of the β-SiAlON phosphor. Therefore, a particle diameter of the metallic silicon powder is preferably 300 μm or less.

In terms of the reactivity, it is more preferred that the smaller the particle diameter of the metallic silicon is, the higher the reactivity of the metallic silicon is. However, since the characteristics such as the particle size distribution and emission may be affected by the mixed raw materials or the sintering rate, it is unnecessary for the metallic silicon to have a small particle diameter, and the metallic silicon is not limited to have a powdery shape.

The aluminum raw material that may be used herein includes at least one selected from the group consisting of metallic aluminum and aluminum compounds including aluminum. Also, the metallic aluminum and the aluminum compound may be used together. The aluminum compound including aluminum that may be used herein includes, for example, aluminum nitride, aluminum oxide, and aluminum hydroxide. When the metallic silicon is used as the silicon raw material, it is unnecessary to use the metallic aluminum as the aluminum raw material, but only the aluminum compound may be used as the silicon raw material.

When the metallic aluminum is used as the aluminum raw material, the metallic aluminum is preferably high-purity metallic aluminum that is in the form of powder and has a low content of impurities such as Fe. From the above-mentioned point of view, the metallic aluminum preferably has a particle diameter of 300 μm or less. However, since the characteristics such as the particle size distribution and emission may be affected by a combination of the raw materials or the sintering rate, it is unnecessary for the metallic aluminum to have a small particle diameter, and the metallic aluminum is not limited to have a powdery shape.

The activator raw material that may be used herein includes one rare earth metal selected from the group consisting of Eu, Ce, Sm, Yb, Dy, Pr and Tb. Specific examples of the activator raw material that may be used herein include oxides such as $Eu_2O_3$, $Sm_2O_3$, $Yb_2O_3$, CeO, $Pr_7O_{11}$ and $Tb_3O_4$; and Eu $(NO_3)_3$ and $EuCl_3$, etc. Preferably, the activator raw material may be Eu or Ce.

The particle size distribution of the β-SiAlON phosphor may be controlled by adjusting a mixing ratio of the silicon raw material and the aluminum raw material. In addition, the particle size distribution of the β-SiAlON phosphor may also be controlled by adjusting a mixing ratio of the metallic silicon and the silicon compound in the silicon raw material, or a mixing ratio of the metallic aluminum and the aluminum compound in the aluminum raw material. Effects of the raw material such as the metallic silicon or metallic aluminum are described in more detail in the following Examples.

The β-SiAlON phosphor prepared according to one exemplary embodiment of the present invention may be a phosphor represented by the following Formula 1.

$$Si_{(6-x)}Al_xO_yN_{(8-y)}:Ln_z \qquad \text{Formula 1}$$

In the Formula 1, Ln is preferably a rare earth element, and the following requirements are preferably satisfied: $0<x\leq4.2$, $0<y\leq4.2$, and $0\leq z\leq1.0$). This β-SiAlON phosphor may be a green-emitting phosphor, and its peak wavelength may be in a range of 500 to 570 nm.

As described above, the β-SiAlON phosphor is prepared by weighing a silicon raw material including metallic silicon, an aluminum raw material including at least one of metallic aluminum and aluminum compound, and an activator including rare earth elements such as Eu, Sm, Yb, Ce, Pr and Tb, mixing the activator with the silicon raw material and the aluminum raw material, filling the resulting raw material mixture with a boron nitride crucible, and firing the raw material mixture under a nitrogen-containing atmosphere.

The raw material mixture reacts under a high-temperature nitrogen atmosphere to form a phosphor. Here, the nitrogen-containing atmospheric gas preferably has an $N_2$ concentration of 90% or more. Also, the nitrogen-containing atmospheric gas may have a gas pressure of 0.1 to 20 Mpa. In order to form a nitrogen atmosphere, a boron nitride crucible is put under a vacuum and a nitrogen-containing atmospheric gas is then introduced into the boron nitride crucible. On the contrary, the nitrogen atmosphere may also be formed by introducing a nitrogen-containing atmospheric gas into a boron nitride crucible without putting the boron nitride crucible under a vacuum. In this case, it is possible to discontinuously introduce the nitrogen-containing atmospheric gas into the boron nitride crucible.

When the raw material mixture including metallic silicon is fired under a nitrogen atmosphere, nitrogen gas serves as a nitrogen source. Here, silicon is nitrized by reaction of nitrogen with the silicon, thus to form a SiAlON phosphor. In this case, since the silicon raw material, the aluminum raw material and the activator react together before or during the nitrization of the silicon, it is possible to prepare a SiAlON phosphor having a uniform composition. In this case, the prepared β-SiAlON phosphor has improved brightness.

In the firing operation, the raw material mixture is preferably heated at a high temperature of 1850 to 2150° C. Although the gas pressure and the firing temperature may be varied according to the compositions of the raw material mixture, the raw material mixture is preferably sintered at a gas pressure of 0.8 Mpa or more and a high temperature of 1900 to 2100° C. to prepare a SiAlON phosphor having high brightness. Then, the heated raw material mixture may be ground into powder and or classified so as to control the particle size distribution. The ground raw material mixture may be re-fired at a high temperature.

Hereinafter, the β-SiAlON phosphor prepared by the method for preparing a β-SiAlON phosphor according to one exemplary embodiment of the present invention is described in more detail, as follows.

In the following Examples, a raw material mixture is prepared by weighing a silicon raw material and an aluminum raw material as the host raw materials and an activator and mixing certain amounts of the host raw materials and the activator in a ball mill or a mixer. The raw material mixture is put into a high-temperature, heat-resistant container such as a boron nitride (BN) crucible, and the BN crucible is loaded in an electric furnace that is able to be heated under a pressure or a vacuum. That is, a β-SiAlON phosphor is prepared by heating the raw material mixture to a temperature of 1800° C. or above at the rising speed of 20° C./min with a gas pressure of 0.2 to 2 Mpa in the nitrogen-containing atmospheric gas.

The phosphors of Examples 1 to 9 were prepared by using the silicon raw materials containing the metallic silicon, the aluminum raw materials and activator raw materials by varying a mixing ratio of them, and the phosphors of Comparative examples 1 to 3 were prepared using the metallic silicon-free silicon raw material. Here, Eu compounds are used as activator raw materials, therefore all the phosphors are Eu-activated β-SiAlON phosphors and also green-emitting phosphors that have a peak wavelength of 520 to 560 nm.

Example 1

Silicon nitride (SiN) and metallic silicon (Si) were used as the silicon raw material, alumina ($Al_2O_3$) was used as the aluminum raw material, and europium oxide ($Eu_2O_3$) was used as the activator. $Si_3N_4$, Si, $Al_2O_3$ and $Eu_2O_3$ were weighed, and 4.047 g of $Si_3N_4$, 5.671 g of Si, 0.589 g of $Al_2O_3$, and 0.141 g of $Eu_2O_3$ were mixed using a mixer and a sieve. Then, the prepared raw material mixture was put into a BN crucible, and the BN crucible that the raw material mixture was put into was loaded into a gas pressured electric furnace. Here, a firing operation was heated from room temperature to 500° C. under a vacuum at first step, and at the next step, an N2 gas was introduced into the electric furnace at 500° C., and at the next, the furnace was heated from 500 to 1950° C. at the rising speed of 5° C./min under an $N_2$ gas atmosphere, and then fired at 1950° C. for 5 hours at a constant gas pressure of 0.8 Mpa or more.

The synthesized phosphor at a high temperature was cooled, extracted from the BN crucible of the electric furnace, and ground. Then, the ground phosphor was sieved through a 100-mesh sieve. This sieved phosphor was washed with hydrofluoric acid and hydrochloric acid, dispersed, dried sufficiently, and sieved through a 50-mesh sieve to obtain a phosphor of Example 1.

Example 2

A β-SiAlON phosphor was prepared in the same manner as in Example 1, except for using 1.349 g of $Si_3N_4$ and 7.291 g of Si instead of 4.047 g of $Si_3N_4$, 5.671 g of Si.

Example 3

A β-SiAlON phosphor was prepared in the same manner as in Example 1, except for using 6.744 g of $Si_3N_4$ and 4.051 g of Si instead of 4.047 g of $Si_3N_4$, 5.671 g of Si.

Example 4

A β-SiAlON phosphor was prepared in the same manner as in Example 1, except for using 9.442 g of $Si_3N_4$ and 2.430 g of Si instead of 4.047 g of $Si_3N_4$, 5.671 g of Si.

Example 5

A β-SiAlON phosphor was prepared in the same manner as in Example 1, except that only Si was used without the use of $Si_3N_4$ as the silicon raw material and 8.101 g of Si was used instead of 4.047 g of $Si_3N_4$, 5.671 g of Si

Comparative Example 1

A β-SiAlON phosphor was prepared in the same manner as in Example 1, except that only 13.488 g of $Si_3N_4$ was used as the silicon raw material without the use of Si instead of 4.047 g of $Si_3N_4$, 5.671 g of Si.

Example 6

Silicon nitride ($Si_3N_4$) and metallic silicon (Si) were used as the silicon raw material, aluminum nitride (AlN) was used as the aluminum raw material, and europium oxide ($Eu_2O_3$) was used as the activator. $Si_3N_1$, Si, AlN and $Eu_2O_3$ were weighed, and 5.395 g of $Si_3N_4$, 3.241 g of Si, 0.379 g of AlN and 0.137 g of $Eu_2O_3$ were mixed using a mixer and a sieve. Then, the prepared raw material mixture was put into a BN crucible, and the BN crucible was loaded into a gas pressured electric furnace. Here, the raw material mixture was fired by heating the raw material mixture to 1450° C. for 5 hours under a nitrogen atmosphere. Then, the fired product was cooled and ground, i.e. the 1$^{st}$ fired products was obtained. The 1$^{st}$ fired product was put into a BN crucible, and the BN crucible was then set in the gas pressured electric furnace. The furnace was heated to 500° C. under a vacuum, and an $N_2$ gas was introduced into the furnace at 500° C. Then the furnace temperature was heated from 500 to 2000° C. at a rising speed of 5° C./min under an $N_2$ gas atmosphere, and then fired at 2000° C. for 5 hours at a constant gas pressure of 0.8 Mpa or more.

The phosphor that was fired at the high temperature was cooled, extracted from the BN crucible, and ground. Then, the ground phosphor was sieved through a 100-mesh sieve. And then was washed with hydrofluoric acid and hydrochloric acid, dispersed, dried sufficiently, and sieved through a 50-mesh sieve to obtain a phosphor of Example 6.

Example 7

A β-SiAlON phosphor was prepared in the same manner as in Example 6, except for using 7.554 g of $Si_3N_4$ and 1.944 g of Si instead of 5.395 g of $Si_3N_4$ and 3.241 g of Si.

Example 8

A β-SiAlON phosphor was prepared in the same manner as in Example 6, except that only Si was used without the use of $Si_3N_4$ as the silicon raw material, and 6.481 g of Si was used instead of 5.395 g of $Si_3N_4$ and 3.241 g of Si

Comparative Example 2

A β-SiAlON phosphor was prepared in the same manner as in Example 6, except that only $Si_3N_4$ was used without the use of Si as the silicon raw material, and 10.791 g of $Si_3N_4$ was used instead of 5.395 g of $Si_3N_4$ and 3.241 g of Si

Example 9

A β-SiAlON phosphor was prepared in the same manner as in Example 6, except that 6.744 g of $Si_3N_4$ and 4.051 g of Si were used as the silicon raw materials, 0.312 g of metallic aluminum (Al) was only used as the aluminum raw material without the use of $Al_2O_3$ or AlN, and 0.172 g of $Eu_2O_3$ was used as the activator instead of the 5.395 g of Si3N4, 3.241 g of Si, 0.379 g of AlN and 0.137 g of Eu2O3.

Comparative Example 3

A β-SiAlON phosphor was prepared in the same manner as in Example 6, except that 13.488 g of $Si_3N_4$ was only used as the silicon raw material without the use of Si, 0.312 g of Al was used as the aluminum raw material and 0.172 g of $Eu_2O_3$ was used as the activator instead of the 5.395 g of Si3N4, 3.241 g of Si, 0.379 g of AlN and 0.137 g of Eu2O3.

Hereinafter, the mixing ratios of the raw materials used in the above-mentioned Examples and Comparative examples are listed in the following Table 1.

TABLE 1

| Ex. No. | $Si_3N_4$ (g) | Si (g) | $Al_2O_3$ (g) | AlN (g) | Al (g) | $Eu_2O_3$ (g) |
|---|---|---|---|---|---|---|
| Ex. 1 | 4.047 | 5.671 | 0.589 | — | — | 0.141 |
| Ex. 2 | 1.349 | 7.291 | 0.589 | — | — | 0.141 |
| Ex. 3 | 6.744 | 4.051 | 0.589 | — | — | 0.141 |
| Ex. 4 | 9.442 | 2.430 | 0.589 | — | — | 0.141 |
| Ex. 5 | — | 8.101 | 0.589 | — | — | 0.141 |
| Comp. ex. 1 | 13.488 | — | 0.589 | — | — | 0.141 |
| Ex. 6 | 5.395 | 3.241 | — | 0.379 | — | 0.137 |
| Ex. 7 | 7.554 | 1.944 | — | 0.379 | — | 0.137 |
| Ex. 8 | — | 6.481 | — | 0.379 | — | 0.137 |
| Comp. ex. 2 | 10.791 | — | — | 0.379 | — | 0.137 |
| Ex. 9 | 6.744 | 4.051 | — | — | 0.312 | 0.172 |
| Comp. ex. 3 | 13.488 | — | — | — | 0.312 | 0.172 |

Figure 1:
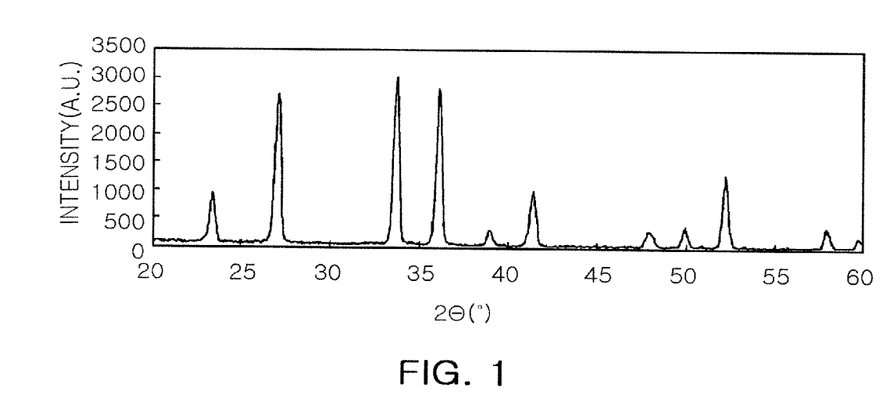
FIG. 1 is a graph illustrating an X-ray diffraction analysis result of a β-SiAlON phosphor prepared in Example 1.

The crystalline phase of the phosphor that was synthesized in Example 1 was identified by using powder X-ray diffraction (XRD), and these results are shown in FIG. 1. From FIG. 1 and JCPDS data, it was revealed that the synthesized phosphor is a β-SiAlON phosphor.

Figure 2:
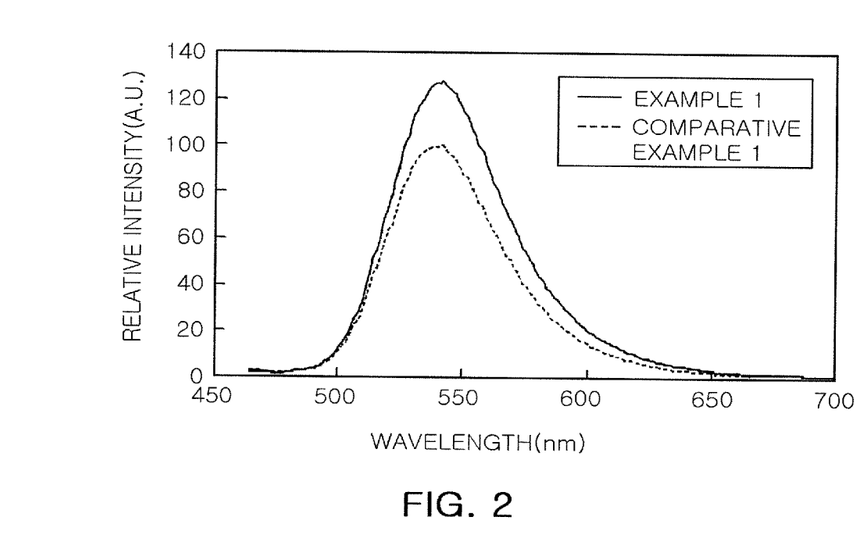
FIG. 2 is a graph illustrating an emission spectrum of the β-SiAlON phosphor prepared in Example 1.
Figure 3:
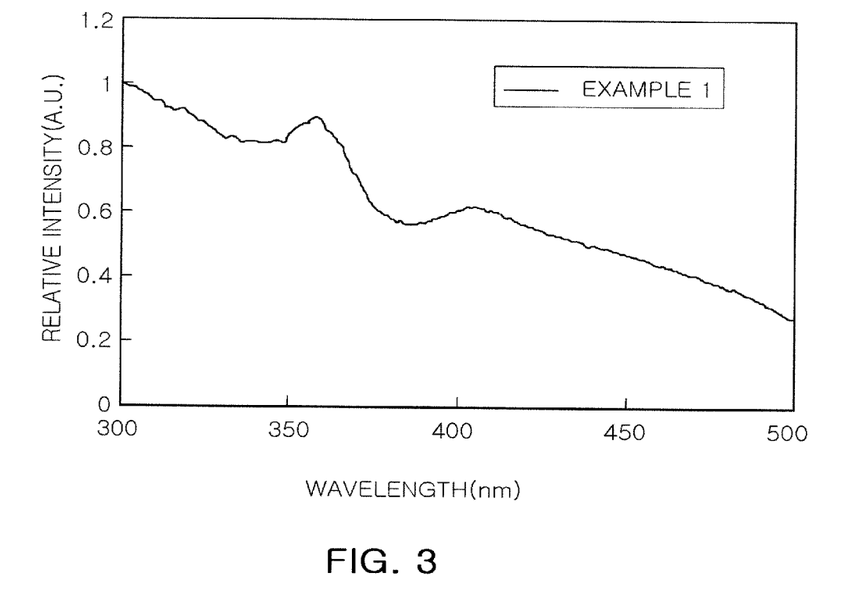
FIG. 3 is a graph illustrating an excitation spectrum of the β-SiAlON phosphor prepared in Example 1.

Also, emissions of the β-SiAlON phosphor were measured by irradiating the β-SiAlON phosphor with excitation light of 460 nm. Then, the emission spectrum results of the β-SiAlON phosphors of Example 1 and Comparative example 1 are shown in FIG. 2. The β-SiAlON phosphor of Example 1 was a green-emitting phosphor that shows its emission peak at 541 nm and full width of half maximum is 54.7 nm. Also, the brightness of the β-SiAlON phosphor of Example 1 was 27% higher than β-SiAlON phosphor of Comparative example 1. The excitation spectrum of the β-SiAlON phosphor prepared in Example 1 was measured at emission maxima wavelength of 541 nm as detection light. The results are shown in FIG. 3. From the above results, it was seen that the excitation spectrum of the β-SiAlON phosphor are observed at excitation wavelengths spanning from ultraviolet rays to visible rays in the vicinity of 500 nm.

7 Parts by weight of each of the β-SiAlON phosphors prepared in Examples 1 to 9 and Comparative examples 1 to 3, 3 parts by weight of a red $CaAlSiN_3$:Eu phosphor, and 10 parts by weight of silicon resin were mixed thoroughly to form slurry. Then, the slurry was injected into a cup on a mount lead equipped with a blue LED chip, and then cured at 130° C. for 1 hour to prepare a white LED device using the β-SiAlON phosphor. The prepared white LED device was measured for brightness.

The emission peak wavelengths of the β-SiAlON phosphors prepared in Examples 1 to 9 and Comparative examples 1 to 3, and brightness of the white LED devices fabricated by using the β-SiAlON phosphors are listed in the following Table 2.

TABLE 2

| | Silicon raw materials | | Aluminum | Emission | |
|---|---|---|---|---|---|
| Ex. No. | Kinds | $Si/Si_3N_4$ (parts by weight) | raw materials Kinds | peak wavelength (nm) | Brightness (%) |
| Ex. 1 | $Si/Si_3N_4$ | 70/30 | $Al_2O_3$ | 541 | 127 |
| Ex. 2 | $Si/Si_3N_4$ | 90/10 | $Al_2O_3$ | 541 | 124 |
| Ex. 3 | $Si/Si_3N_4$ | 50/50 | $Al_2O_3$ | 541 | 124 |
| Ex. 4 | $Si/Si_3N_4$ | 30/70 | $Al_2O_3$ | 541 | 107 |
| Ex. 5 | Si | 100/0 | $Al_2O_3$ | 541 | 118 |
| Comp. ex. 1 | $Si_3N_4$ | 0/100 | $Al_2O_3$ | 541 | 100 |
| Ex. 6 | $Si/Si_3N_4$ | 50/50 | AlN | 540 | 113 |
| Ex. 7 | $Si/Si_3N_4$ | 30/70 | AlN | 538 | 115 |
| Ex. 8 | Si | 100/0 | AlN | 540 | 106 |
| Comp. ex. 2 | $Si_3N_4$ | 0/100 | AlN | 540 | 100 |
| Ex. 9 | $Si/Si_3N_4$ | 50/50 | Al | 540 | 119 |
| Comp. ex. 3 | $Si_3N_4$ | 0/100 | Al | 536 | 100 |

From the above results, it was revealed that the β-SiAlON phosphors prepared in Examples 1 to 9 and Comparative examples 1 to 3 are green-emitting phosphors since their emission peak wavelengths are about 540 nm and the white LED devices fabricated by using the β-SiAlON phosphors of Examples 1 to 3 have brightness from 124 to 127%.

However, in the case of Example 4, in which the ratio of metallic silicon was smaller than that of silicon nitride, a lower level of brightness was provided than in the case of Example 1 and Example 3 in which the ratio of metallic silicon was higher than that of silicon nitride. The cases of Examples 5 and 8, in which only Si was used as silicon raw material, may provide a lower level of brightness than those of Examples 1 to 3 and Example 6. Meanwhile, the cases of Examples 5 and 8 may provide a higher level of brightness than those of Example 4 in which the ratio of metallic silicon was smaller than that of silicon nitride and Example 7 in which the ratio of metallic silicon was smaller as compared to Example 6. Accordingly, a β-SiAlON phosphor capable of providing a relatively higher level of brightness may be manufactured by using metallic silicon.

In Comparative examples 1 to 3 in which only $Si_3N_4$ was used as the silicon raw material, the level of brightness was respectively 100, thus it can be confirmed through the Comparative examples that brightness was relatively low as compared to Examples in which metallic silicon was not used as the host raw material.

Further, when metallic silicon and metallic aluminum are used together, similarly to Example 9, a relatively high level of brightness can be also obtained.

Figure 4:
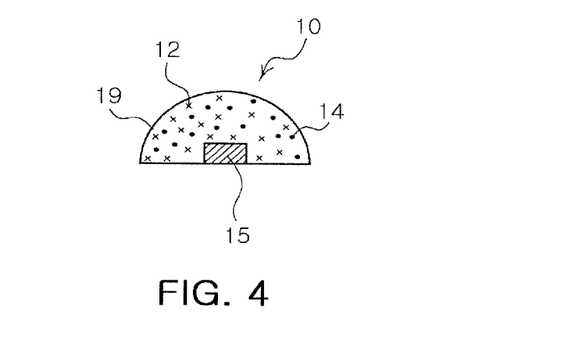
FIG. 4 is a schematic view of a white LED device according to an exemplary embodiment of the present invention.

FIG. 4 is a schematic view of a white light emitting diode (LED) device according to an exemplary embodiment of the present invention.

As shown in FIG. 4, a white LED device 10 according to this embodiment includes a blue LED chip 15 and a resin encapsulation part 19 encapsulating the blue LED chip 15 and having an upwardly curved lens shape.

In this embodiment, the resin encapsulation part 19 has the shape of a hemispherical lens in order to ensure wide light emission directivity. The blue LED chip 15 may be mounted directly on a separate circuit board. The resin encapsulation part 19 may be formed of a silicon resin, an epoxy resin or a combination thereof. Green phosphors 12 and red phosphors 14 are dispersed within the resin encapsulation part 19.

The green phosphors 12 that can be used for this embodiment may be at least one selected from the group consisting of $M_2SiO_4$:Eu,Re silicate-based phosphors, $MA_2D_4$:Eu,Re sulfide-based phosphors, β-SiAlON:Eu,Re phosphors, and $M'A'_2O_4$:Ce,Re' oxide-based phosphors.

Here, M represents at least two elements selected from the group consisting of Ba, Sr, Ca and Mg, A represents at least one selected from the group consisting of Ga, Al and In, D represents at least one selected from the group consisting of S, Se and Te, M' represents at least one selected from the group consisting of Ba, Sr, Ca and Mg, A' represents at least one selected from the group consisting of Sc, Y, Gd, La, Lu, Al and In, Re represents at least one selected from the group consisting of Y, La, Ce, Nd, Pm, Sm, Gd, Tb, Dy, Ho, Er, Tm, Yb, Lu, F, Cl, Br and I, and Re' represents at least one of Nd, Pm, Sm, Tb, Dy, Ho, Er, Tm, Yb, F, Cl, Br and I. The amount of Re and Re' being added ranges from 1 ppm to 50000 ppm.

The red phosphors 14 that can be used for this embodiment are at least one selected from the group consisting of M'AlSiN$_x$:Eu,Re (1≤x≤5) nitride-based phosphors and M'D:Eu,Re sulfide-based phosphors.

Here, M' is at least one selected from the group consisting of Ba, Sr, Ca and Mg, and D is at least one selected from the group consisting of S, Se and Te. A' is at least one selected from the group consisting of Sc, Y, Gd, La, Lu, Al and In, and Re is at least one selected from the group consisting of Y, La, Ce, Nd, Pm, Sm, Gd, Tb, Dy, Ho, Er, Tm, Yb, Lu, F, Cl, Br and I. The amount of Re being added ranges from 1 ppm to 50000 ppm.

As described above, the present invention can provide white light having a high color rendering index of 70 or higher by combining specific green phosphors and specific red phosphors in due consideration of a full width at half maximum (FWHM), a peak wavelength and/or conversion efficiency. Also, the use of the plurality of phosphors provides light of various wavelength ranges, thereby enhancing color reproducibility.

The dominant wavelength of light emitted from the blue LED chip 15 may range from 430 nm to 455 nm. In this case, the green phosphors 12 may provide light having a peak wavelength of 500 nm to 550 nm, and the red phosphors 14 may provide light having a peak wavelength of 610 nm to 660 nm so as to secure a wide spectrum within the visible wavelength range and thus increase a color rendering index The blue LED chip 14 may emit light having an FWHM of 10 nm to 30 nm, the green phosphor 12 may provide light having an FWHM of 30 nm to 100 nm, and the red phosphor 14 may provide light having an FWHM of 50 nm to 150 nm.

According to another exemplary embodiment of the present invention, yellow or orange phosphors may be additionally included in addition to the red phosphors 12 and the green phosphors 14, so that the color rendering index may be further increased. This embodiment is illustrated in FIG. 5.

Figure 5:
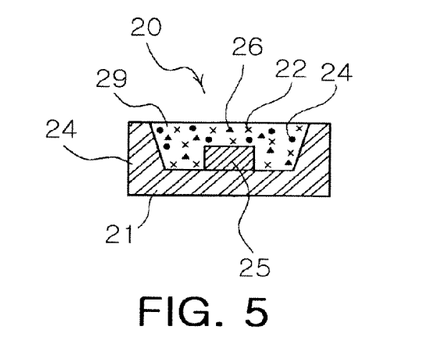
FIG. 5 is a schematic view of a white LED device according to another exemplary embodiment of the present invention.

Referring to FIG. 5, a white LED device 20, according to this embodiment, includes a package body 21 having a reflection cup at its center, a blue LED chip 25 mounted on the bottom of the reflection cup, and a transparent resin encapsulation part 29 filled in the reflection cup to encapsulate the blue LED chip 25.

The resin encapsulation part 29 may be formed of, for example, a silicon resin, an epoxy resin or a combination thereof. According to this embodiment, the transparent resin encapsulation part 29 includes third phosphors 26, which are yellow or orange phosphors, as well as green phosphors 22 described with reference to FIG. 2 and red phosphors 24.

That is, the green phosphors 22 may be at least one phosphor selected from the group consisting of $M_2SiO_4$:Eu,Re silicate-based phosphors, $MA_2D_4$: Eu, Re sulfide-based phosphors, β-SiAlON:Eu,Re phosphors, and M'A'$_2$O$_4$:Ce, Re' oxide-based phosphors. The red phosphors 24 are at least one selected from the group consisting of M'AlSiN$_x$:Eu,Re (1≤x≤5) nitride-based phosphors and M'D:Eu,Re sulfide-based phosphors.

The white LED device 20 according to this embodiment further includes third phosphors 26. The third phosphors 26 may be yellow or orange phosphors that can provide light having a wavelength range between the green and red wavelength ranges. The yellow phosphors may be silicate-based phosphors, and the orange phosphors may be α-SiAlON:Eu, Re phosphors.

According to this embodiment, two or more kinds of phosphor powder are mixed and dispersed within the area of a single resin encapsulation part. However, the present invention is not limited thereto, and different structures may be used, modified and embodied in a variety of forms. In more detail, the two or three kinds of phosphors may be provided as different layers, respectively. For example, the green phosphors, the red phosphors and the yellow or orange phosphors may be dispersed under high pressure, so that the resin encapsulation part 29 can have a multilayered phosphorous structure.

Figure 6:
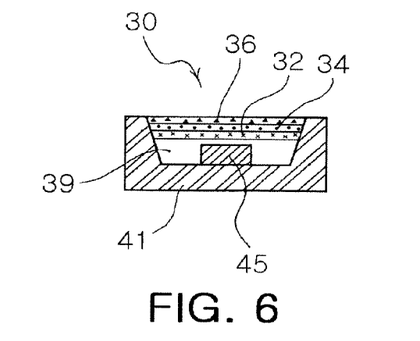
FIG. 6 is a schematic view of a white LED device according to another exemplary embodiment of the present invention.

Unlike the above description, a plurality of resin layers each containing a different phosphor (hereinafter, also referred to as phosphor-containing resin layers) may be further provided as shown in FIG. 6.

Similarly to the previous embodiment, a white LED device 30, according to this embodiment of FIG. 6, includes a package body 31 having a reflection cup at its center, a blue LED chip 35 mounted on the bottom of the reflection cup, and a transparent resin encapsulation part 39 filled in the reflection cup to encapsulate the blue LED chip 35.

Respective resin layers containing different phosphors are provided on the resin encapsulation part 39. In detail, a wavelength conversion part may be configured, which includes a first resin layer 32 containing the green phosphors, a second resin layer 34 containing the red phosphors, and a third resin layer 36 containing the yellow or orange phosphors.

The phosphors used in this embodiment may be identical or similar to those described with reference to FIG. 5.

White light obtained by use of the combination of the phosphors, according to the exemplary embodiments of the present invention, may achieve a high color rendering index. This will now be described in more detail with reference to FIG. 7.

Figure 7:
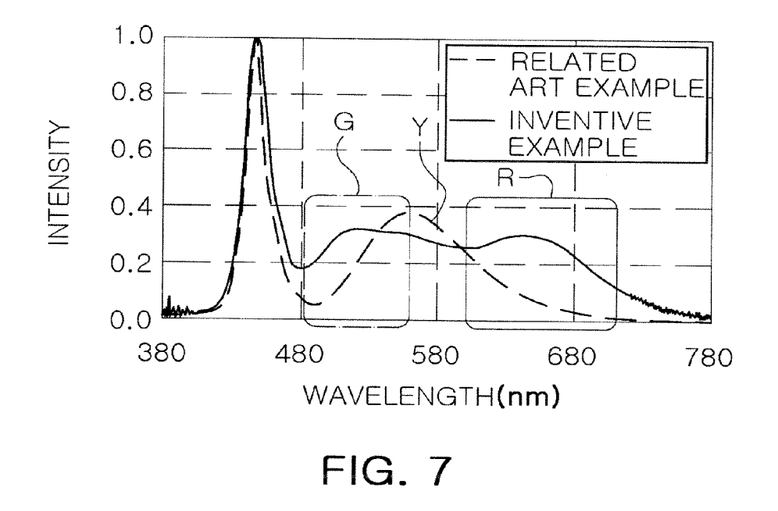
FIG. 7 illustrates the light emission spectrum of a white LED device according to an exemplary embodiment of the present invention.

In a related art example of FIG. 7, a blue LED chip and yellow phosphors are combined, thus obtaining converted yellow light as well as blue wavelength light. This related art example emits little light in green and red wavelength ranges in regard to the entire spectrum of visible light, thus failing to ensure a color rendering index close to that of natural light. Particularly, the converted yellow light has a narrow FWHM to obtain high conversion efficiency, which may lower the color rendering index even more. Also, in the existing example, it is difficult to ensure high color reproducibility, because the characteristics of white light are susceptible to the extent to which the conversion into yellow light occurs.

In contrast, in an inventive example, a blue LED chip, green phosphors G and red phosphors R was combined, thereby emitting light in the green and red wavelength ranges, unlike the related art example. Thus, the inventive example can ensure a wider spectrum within the visible wavelength range, and consequently, significantly increase a color rendering index. Also, the color rendering index can be further increased by additional use of yellow or orange phosphors that can provide light in a middle wavelength range between the green and red wavelength ranges.

The green phosphors, the red phosphors, and the yellow or orange phosphors which can be selectively added, will now be described in more detail with reference to FIGS. 8A through 8D, 9A and 9B and 10A and 10B.

FIGS. 8A through 10B illustrate the wavelength spectrums of phosphors proposed for use in the present invention (a blue LED chip: about 440 nm).

FIGS. 8A through 8D show the spectrums of light provided from green phosphors employed in the present invention.

Figure 8A:
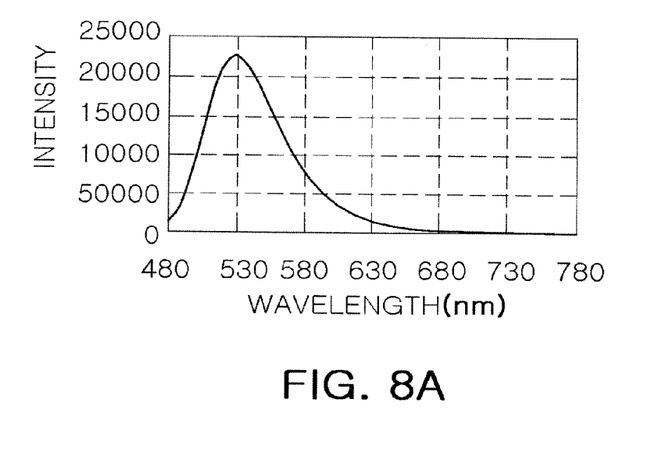
FIGS. 8A through 8D illustrate wavelength spectrums showing the light emission characteristics of green phosphors that can be used in the present invention.

FIG. 8A shows the spectrum of light in the case of using $M_2SiO_4$:Eu,Re silicate-based phosphors where M represents at least two selected from the group consisting of Ba, Sr, Ca and Mg, Re represents at least one selected from the group consisting of Y, La, Ce, Nd, Pm, Sm, Gd, Tb, Dy, Ho, Er, Tm, Yb, Lu, F, Cl, Br and I, and Re ranges from 1 ppm to 50000 ppm. Converted green light has a peak wavelength of about 530 nm and an FWHM of about 65 nm.

Figure 8B:
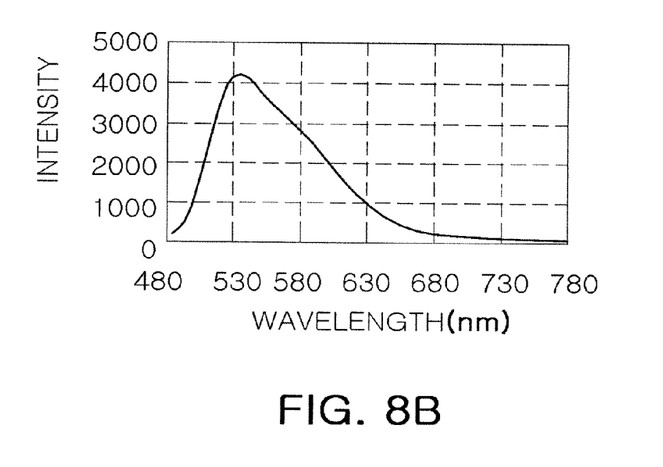

FIG. 8B shows the spectrum of light in the case of using $M'A'_2O_4$:Ce,Re' oxide-based phosphors where M' represents at least one selected from the group consisting of Ba, Sr, Ca and Mg, A' represents at least one selected from the group consisting of Sc, Y, Gd, La, Lu, Al and In, Re' is at least one selected from the group consisting of Nd, Pm, Sm, Tb, Dy, Ho, Er, Tm, Yb, F, Cl, Br and I, and Re' ranges from 1 ppm to 50000 ppm. Converted green light has a peak wavelength of about 515 nm and an FWHM of about 100 nm.

Figure 8C:
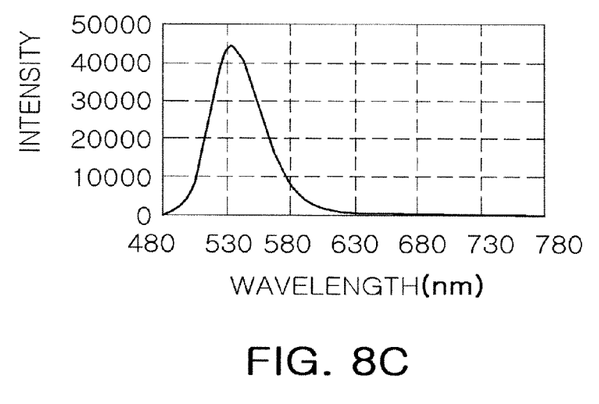

FIG. 8C shows the spectrum of light in the case of using $MA_2D_4$:Eu,Re sulfide-based phosphors where M represents at least two selected from the group consisting of Ba, Sr, Ca and Mg, A represents at least one selected from the group consisting of Ga, Al and In, D represents at least one selected from the group consisting of 5, Se and Te, Re represents at least one selected from the group consisting of Y, La, Ce, Nd, Pm, Sm, Gd, Tb, Dy, Ho, Er, Tm, Yb, Lu, F, Cl, Br and I, and Re ranges from 1 ppm to 50000 ppm. Converted green light has a peak wavelength of about 535 nm and an FWHM of about 60 nm.

Figure 8D:
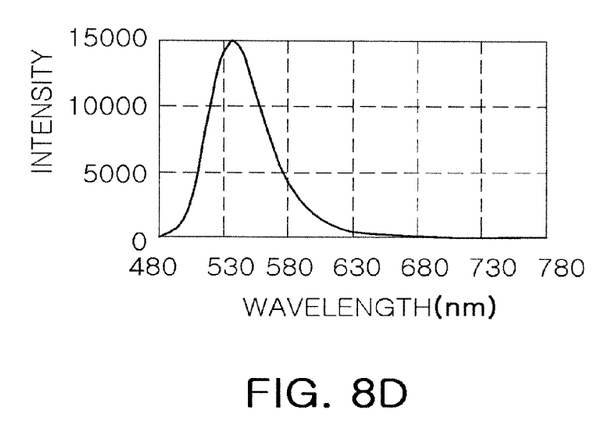

FIG. 8D shows the spectrum of light in the case of using β-SiAlON:Eu,Re phosphors where Re represents at least one selected from the group consisting of Y, La, Ce, Nd, Pm, Sm, Gd, Tb, Dy, Ho, Er, Tm, Yb, Lu, F, Cl, Br and I, and Re ranges from 1 ppm to 50000 ppm. Converted green light has a peak wavelength of about 540 nm and an FWHM of about 45 nm.

Figure 9A:
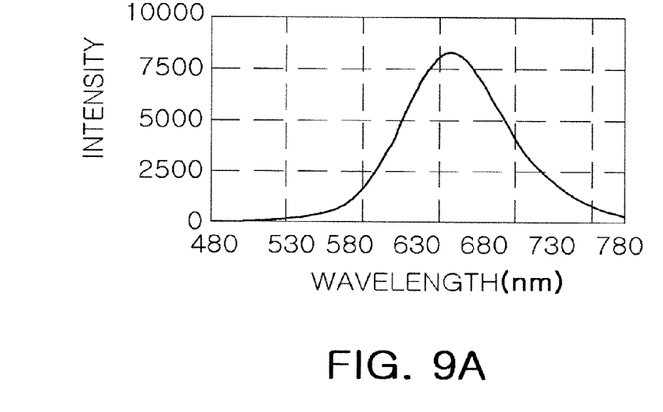
FIGS. 9A and 9B illustrate wavelength spectrums showing the light emission characteristics of red phosphors that can be used in the present invention.
Figure 9B:
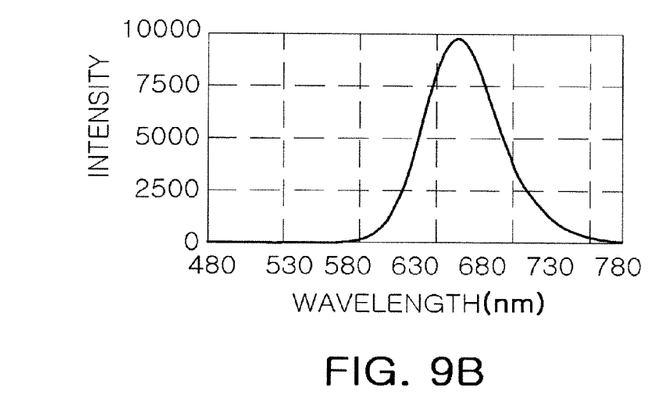

FIGS. 9A and 9B show the spectrums of light provided from red phosphors employed in the present invention.

FIG. 9A shows the spectrum of light in the case of using $M'AlSiN_x$:Eu,Re (1≤x≤5) nitride-based phosphors where M' represents at least one selected from the group consisting of Ba, Sr, Ca and Mg, Re represents at least one selected from the group consisting of Y, La, Ce, Nd, Pm, Sm, Gd, Tb, Dy, Ho, Er, Tm, Yb, Lu, F, Cl, Br and I, and Re ranges from 1 ppm to 50000 ppm. Converted red light has a peak wavelength of about 640 nm and an FWHM of about 85 nm.

FIG. 9B shows the spectrum of light in the case of using M'D:Eu,Re sulfide-based phosphors where M' represents at least one selected from the group consisting of Ba, Sr, Ca and Mg, D represents at least one selected from the group consisting of 5, Se and Te, Re represents at least one selected from the group consisting of Y, La, Ce, Nd, Pm, Sm, Gd, Tb, Dy, Ho, Er, Tm, Yb, Lu, F, Cl, Br and I, and Re ranges from 1 ppm to 50000 ppm. Converted red light has a peak wavelength of about 655 nm and an FWHM of about 55 nm.

Figure 10A:
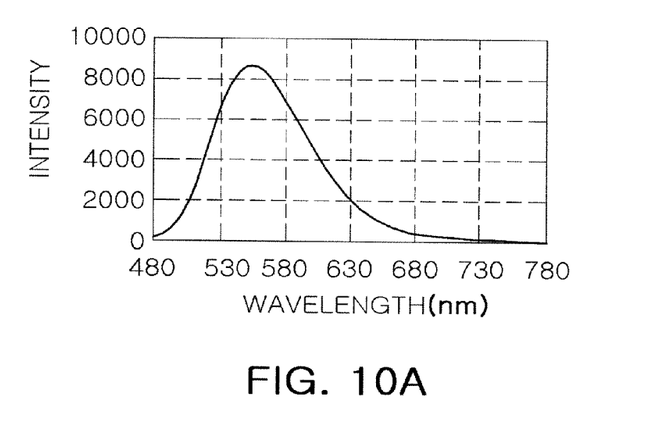
FIGS. 10A and 10B illustrate wavelength spectrums showing the light emission characteristics of yellow phosphors that can be used in the present invention.
Figure 10B:
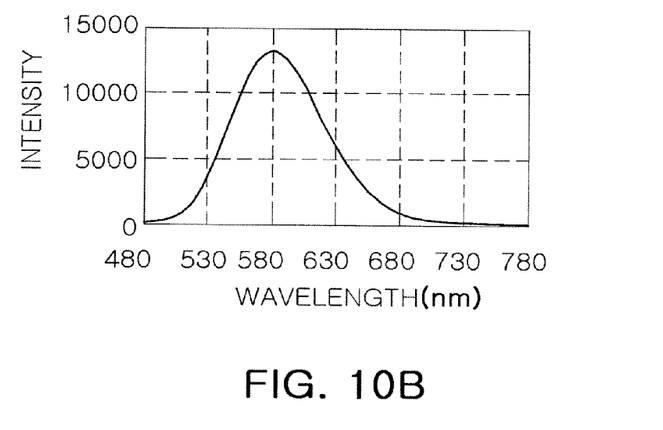

FIGS. 10A and 10B show the spectrums of light provided from yellow or orange phosphors that can be selectively used in the present invention.

FIG. 10A shows the spectrum of light in the case of using silicate-based phosphors. Converted yellow light has a peak wavelength of about 555 nm and an FWHM of about 90 nm.

FIG. 10B shows the spectrum of light in the case of using α-SiAlON:Eu,Re phosphors where Re represents at least one selected from the group consisting of Y, La, Ce, Nd, Pm, Sm, Gd, Tb, Dy, Ho, Er, Tm, Yb, Lu, F, Cl, Br and I, and Re ranges from 1 ppm to 50000 ppm. Converted yellow light has a peak wavelength of about 580 nm, and an FWHM of about 35 nm.

According to the present invention, white light having a high color rendering index of 70 or higher can be provided by use of a combination of specific green phosphors and specific red phosphors or adding yellow or orange phosphors to the combination in due consideration of an FWHM, a peak wavelength and/or conversion efficiency.

If the dominant wavelength of light emitted from the blue LED chip ranges from 430 nm to 455 nm, the green phosphor may provide light having a peak wavelength of 500 nm to 550 nm, and the red phosphor may provide light having a peak wavelength of 610 nm to 660 nm. The yellow or orange phosphor may provide light having a peak wavelength of 550 nm to 600 nm.

If the FWMH of light emitted from the blue LED chip ranges from 10 nm to 30 nm, the green phosphor may provide light having an FWHM of 30 nm to 100 nm, and the red phosphor may provide light having an FWHM of 50 nm to 150 nm. The yellow or orange phosphor may provide light having a peak wavelength of 20 nm to 100 nm.

Through the selection and combination of the phosphors according to the present invention, a wide spectrum can be ensured within the visible wavelength range, and high-quality white light with a high color rendering index can be provided.

Figure 11:
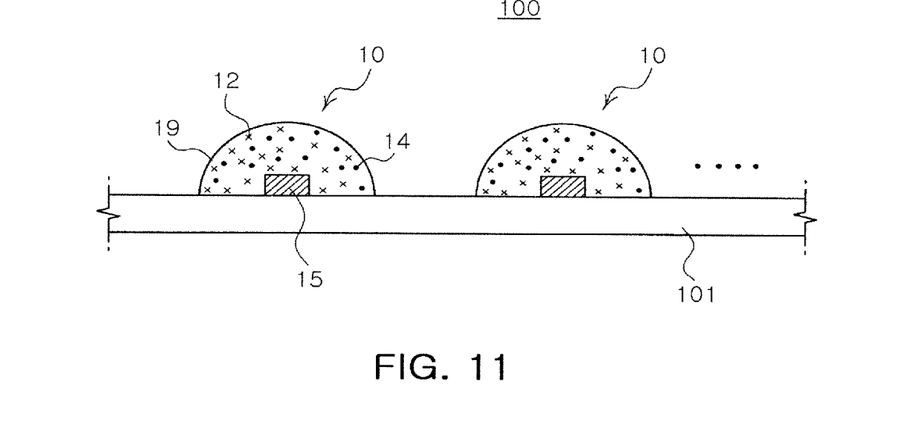
FIG. 11 is a schematic cross-sectional view of a white light source module according to an exemplary embodiment of the present invention.
Figure 12:
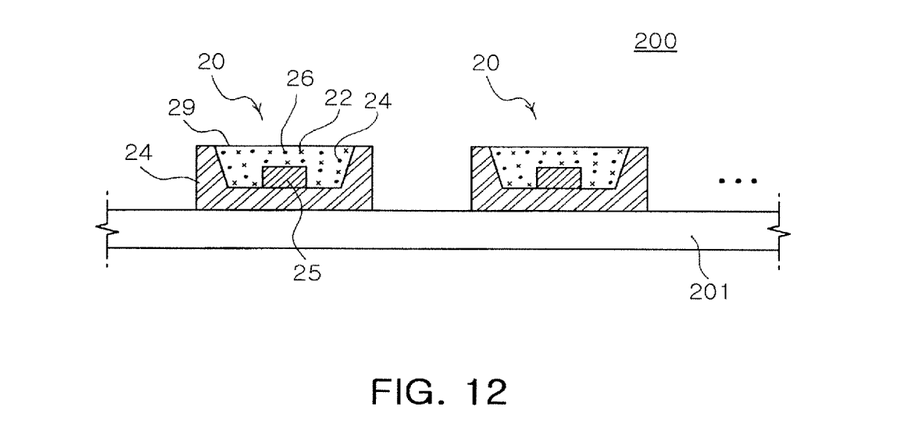
FIG. 12 is a schematic cross-sectional view of a white light source module according to another exemplary embodiment of the present invention.

According to the present invention, a white light source module may be provided, which may be utilized as a light source of an LCD backlight unit. That is, the white light source module according to the present invention may serve as a light source of an LCD backlight, constructing a backlight assembly in combination with various optical members, such as a diffusion plate, a reflection plate and a prism sheet. FIGS. 9 and 10 illustrate such white light source modules.

Referring to FIG. 11, a white light emitting diode (LED) module 100 for an LCD backlight includes a circuit board 101 and arrays of a plurality of white LED devices 100 mounted on the circuit board 101. Conductive patterns (not shown) connected to the LED devices 10 may be formed on the top of the circuit board 101.

Each of the white LED devices 10 may be understood as a white LED device described above with reference to FIG. 4. That is, blue LED chips 15 are mounted directly on the circuit board 101 by a chip on board (COB) method. Each of the white LED devices 10 includes a hemispherical resin encapsulation part 19 having a lens function without using a separate reflection wall, thereby realizing a wide angle of directivity. The wide angle of directivity of each white LED device may be contributive to achieving a reduction in the size, thickness or width of an LCD display.

Referring to FIG. 12, a white LED module 200 for an LCD backlight includes a circuit board 201, and arrays of a plurality of LED devices 20 mounted on the circuit board 201. As described with reference to FIG. 5, each white LED device 20 includes a blue LED chip 25 mounted inside a reflection cup of a package body 21, and a resin encapsulation part 29 encapsulating the blue LED chip 25. In the resin encapsulation part 29, yellow or orange phosphors 26 are dispersed, as well as green and red phosphors 22 and 24.

While the present invention has been shown and described in connection with the exemplary embodiments, it will be apparent to those skilled in the art that modifications and variations can be made without departing from the spirit and scope of the invention as defined by the appended claims.

What is claimed is:

1. A method for preparing a β-SiAlON phosphor, the method comprising:

weighing starting materials in order to prepare the β-SiAlON phosphor represented by Formula: $Si_{(6-x)}Al_xO_yN_{(8-y)}:Ln_z$ (wherein Ln is a rare earth element, and the following requirements are satisfied: $0<x\leq4.2$, $0<y\leq4.2$ and $0<z\leq1.0$), mixing the starting materials to prepare a raw material mixture; and firing the raw material mixture in a nitrogen-containing atmospheric gas, wherein the starting materials comprise:

a host raw material including a silicon raw material including a metallic silicon and optionally a silicon compound, and at least one aluminum raw material selected from the group consisting of a metallic aluminum and an aluminum compound, wherein at least one of the silicon raw material and the aluminum raw material contains both metal and compound; and at least one activator raw material selected from rare earth elements for activating the host raw material, wherein the method further comprises the step of adjusting a mixture ratio of the metallic silicon to the silicon compound to control the particle size distribution of the β-SiAlON phosphor such that the mixture ratio of the metallic silicon to the silicon compound is greater than 1.

2. The method of claim 1, wherein the rare earth element includes Eu or Ce.

3. The method of claim 1, wherein the silicon raw material includes at least one of silicon nitride and silicon oxide.

4. The method of claim 1, wherein the aluminum compound includes at least one selected from the group consisting of aluminum nitride, aluminum oxide and aluminum hydroxide.

5. The method of claim 1, wherein the β-SiAlON phosphor has a peak wavelength of 500 to 570 nm.

6. The method of claim 1, wherein the nitrogen-containing atmospheric gas has an $N_2$ concentration of 90% or more.

7. The method of claim 1, wherein the nitrogen-containing atmospheric gas has a gas pressure of 0.1 to 20 Mpa.

8. The method of claim 1, wherein the operation of firing the raw material mixture is performed at a temperature of 1850 to 2150° C.

* * * * *